US009724762B2

(12) United States Patent
Sobana et al.

(10) Patent No.: US 9,724,762 B2
(45) Date of Patent: Aug. 8, 2017

(54) SURFACE-COATED CUTTING TOOL WITH HARD COATING LAYER EXHIBITING EXCELLENT CHIPPING RESISTANCE AND WEAR RESISTANCE

(71) Applicant: MITSUBISHI MATERIALS CORPORATION, Tokyo (JP)

(72) Inventors: Akira Sobana, Joso (JP); Shin Nishida, Joso (JP); Takahiro Okuyama, Joso (JP); Yoko Watanabe, Joso (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 208 days.

(21) Appl. No.: 14/364,194

(22) PCT Filed: Dec. 20, 2012

(86) PCT No.: PCT/JP2012/083050
§ 371 (c)(1),
(2) Date: Jun. 10, 2014

(87) PCT Pub. No.: WO2013/099752
PCT Pub. Date: Jul. 4, 2013

(65) Prior Publication Data
US 2014/0377024 A1    Dec. 25, 2014

(30) Foreign Application Priority Data
Dec. 26, 2011  (JP) .................................. 2011-284553

(51) Int. Cl.
*B23B 27/14*    (2006.01)
*C23C 16/36*    (2006.01)
(Continued)

(52) U.S. Cl.
CPC ............ *B23B 27/148* (2013.01); *C23C 16/30* (2013.01); *C23C 16/303* (2013.01); *C23C 16/32* (2013.01);
(Continued)

(58) Field of Classification Search
USPC .................. 51/307, 309; 428/698, 701, 702; 407/119
See application file for complete search history.

(56) References Cited

U.S. PATENT DOCUMENTS 6,733,874 B2 *  5/2004  Ueda ..................... C23C 16/403
                                                      428/702
2007/0104945 A1 *  5/2007  Ruppi ..................... C23C 16/36
                                                      428/701

(Continued)

FOREIGN PATENT DOCUMENTS

EP      1288335 B1  †  5/2010
JP      04-300104 A      10/1992
(Continued)

OTHER PUBLICATIONS

International Search Report mailed Apr. 2, 2013 for the corresponding PCT Application No. PCT/JP2012/083050.
(Continued)

*Primary Examiner* — Archene Turner
(74) *Attorney, Agent, or Firm* — Leason Ellis LLP

(57) ABSTRACT

A surface-coated cutting tool with a hard coating layer exhibits excellent chipping resistance and wear resistance in a high-speed cutting process. The surface-coated cutting tool comprises a lower layer consisting of a titanium compound layer and an upper layer consisting of an aluminum oxide layer deposited on a surface of a tool substrate constituted of a tungsten carbide-based cemented carbide as a hard coating layer. In the upper layer, a (006) plane texture coefficient (Continued)

TC(006) is 1.8 or more, a ratio I(104)/I(110) of a peak intensity I(104) of an (104) plane to a peak intensity I(110) of an (110) plane is in a range of 0.5 to 2.0, and furthermore, an absolute value of a residual stress in the aluminum oxide layer is 100 MPa or less.

1 Claim, 1 Drawing Sheet

(51) Int. Cl.
    *C23C 16/30*     (2006.01)
    *C23C 16/32*     (2006.01)
    *C23C 16/40*     (2006.01)
    *C23C 16/56*     (2006.01)

(52) U.S. Cl.
    CPC ............ *C23C 16/36* (2013.01); *C23C 16/403* (2013.01); *C23C 16/56* (2013.01); *B23B 2222/88* (2013.01); *B23B 2224/04* (2013.01); *Y10T 407/27* (2015.01)

(56) References Cited

U.S. PATENT DOCUMENTS

| | | | |
|---|---|---|---|
| 2009/0017289 A1* | 1/2009 | Zackrisson | ......... C23C 16/0272 407/119 |
| 2009/0297835 A1 | 12/2009 | Okada et al. | |
| 2010/0139472 A1* | 6/2010 | Sundstrom | .............. C23C 16/36 419/15 |

FOREIGN PATENT DOCUMENTS

| | | | |
|---|---|---|---|
| JP | H04-300104 | † | 10/1992 |
| JP | 11-140647 | A | 5/1999 |
| JP | 2007-125686 | A | 5/2007 |
| JP | 2009-028894 | A | 2/2009 |
| WO | WO-2006/064724 | A | 6/2006 |
| WO | WO-2009/011648 | A | 1/2009 |
| WO | WO-2010/071585 | A | 6/2010 |

OTHER PUBLICATIONS

Opposition filed Feb. 16, 2016 in the Japan Patent Office (JPO) by a third party against the corresponding Japanese Patent No. 5757232.
Notice of Reasons for Revocation mailed Mar. 17, 2016 by the JPO for the corresponding Japanese Patent No. 5757232.
Opinion filed May 13, 2016 by the Applicant for the corresponding Japanese Patent No. 5757232.
JPO's Decision on Opposition mailed Aug. 16, 2016 by the JPO for the corresponding Japanese Patent No. 5757232.
[No Author Listed]; JCPDS Card No. 46-1212; JCPDS-International Centre for Diffraction Data; Copyright 1998; [retrieved on Dec. 11, 2015]; Retrieved from the Internet, URL: http://www.icdd.com/resources/webpdf/corundumc.pdf.†

\* cited by examiner
† cited by third party

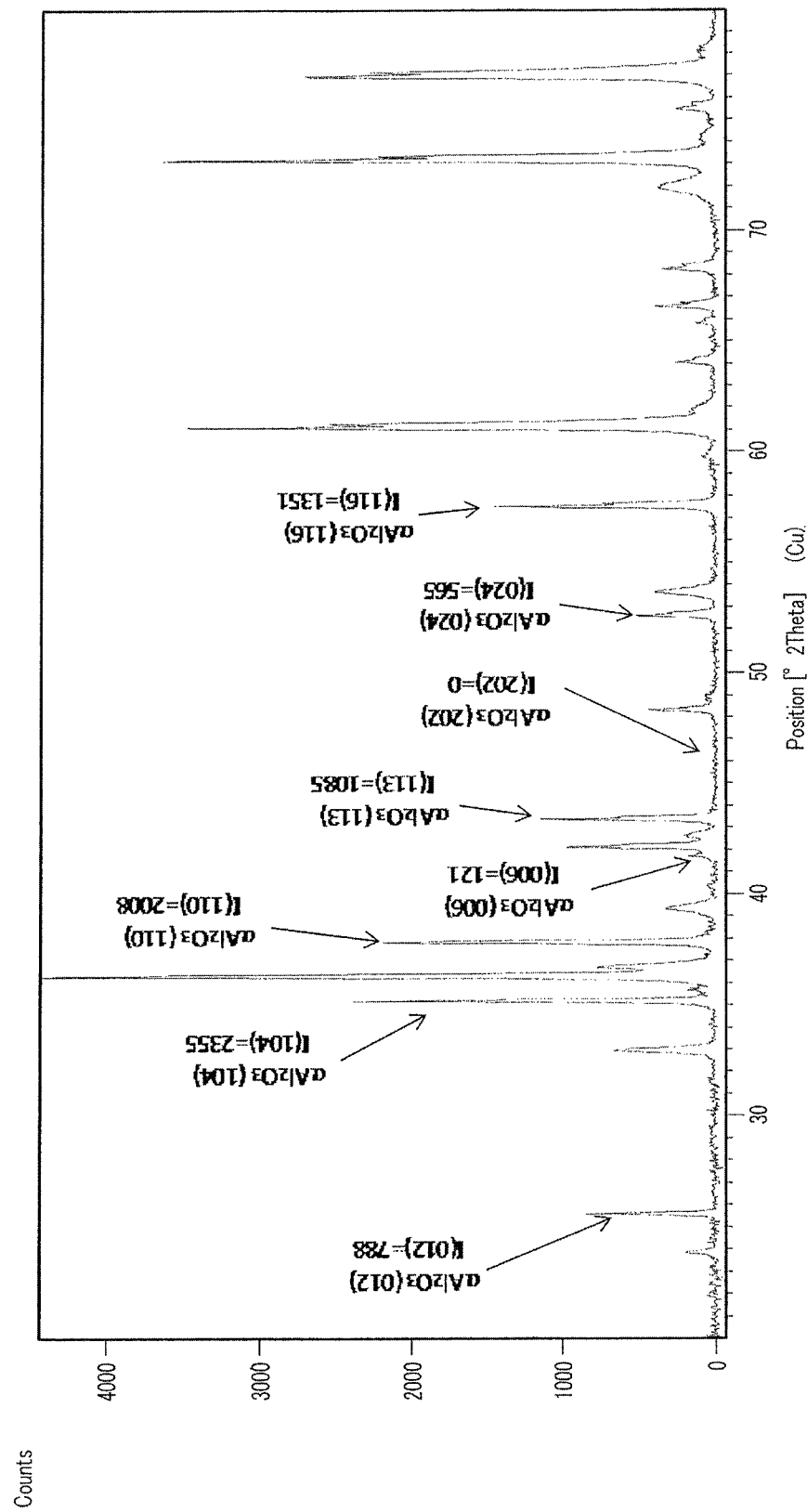

SURFACE-COATED CUTTING TOOL WITH HARD COATING LAYER EXHIBITING EXCELLENT CHIPPING RESISTANCE AND WEAR RESISTANCE

CROSS-REFERENCE TO RELATED PATENT APPLICATIONS

This application is a U.S. National Phase Application under U.S.C. §371 of International Patent Application No. PCT/JP2012/083050, filed Dec. 20, 2012, and claims the benefit of Japanese Patent Application No. 2011-284553, filed on Dec. 26, 2011, all of which are incorporated by reference in their entirety herein. The International Application was published in Japanese on Jul. 4, 2013 as International Publication No. WO/2013/099752 under PCT Article 21(2).

FIELD OF THE INVENTION

The present invention relates to a surface-coated cutting tool (hereinafter, referred to as a coated tool) that is provided with a hard coating layer having excellent chipping resistance and wear resistance and exhibits excellent cutting performance over long-term use in a high-speed cutting process of, for example, a high-toughness difficult-to-cut material such as ductile cast iron.

BACKGROUND OF THE INVENTION

In the past, a coated tool obtained by forming a hard coating layer constituted of the following (a) and (b) on a surface of a substrate constituted of a tungsten carbide (hereinafter represented by WC)-based cemented carbide (hereinafter referred to as tool substrate) has generally been known:

(a) a Ti compound layer having a total average layer thickness in a range of 3 µm to 20 µm and consisting of two or more layers of a Ti carbide (hereinafter represented by TiC) layer, a Ti nitride (hereinafter, similarly, represented by TiN) layer, a Ti carbonitride (hereinafter represented by TiCN) layer, a Ti carboxide (hereinafter represented by TiCO) layer and a Ti carbon-nitrogen oxide (hereinafter represented by TiCNO) layer all of which are chemically deposited as a lower layer, and (b) a chemically-deposited aluminum oxide (hereinafter represented by $Al_2O_3$) layer having an average layer thickness in a range of 1 µm to 15 µm as an upper layer, and it has also been known that a coated tool coated with the above-described hard coating layer exhibits excellent wear resistance.

In addition, a variety of studies have been conducted to further improve a variety of cutting performances required for a cutting tool, and, for example, to improve the plastic deformation resistance, high toughness and wear resistance of a coated tool, as described in JP-A-2009-28894, a coated tool has been proposed in which a surface of a tool substrate is coated with a Ti compound layer and an $Al_2O_3$ layer, and regarding the texture coefficient TC of the $Al_2O_3$ layer, the TC(006) is set to be larger than 2, and furthermore, the second largest texture coefficient TC(104) is set to satisfy 2>TC(104)>0.5.

However, with the above-described coated tool, while the wear resistance of the coat improved, there was a problem of poor chipping resistance and fracture resistance.

In addition, as described in JP-A-H11-140647, a coated tool has been proposed as well in which a surface of a tool substrate is coated with a Ti compound layer and an $Al_2O_3$ layer, and regarding the texture coefficient TC of the $Al_2O_3$ layer, TC(104) and TC(110) are set to be larger than 1.2.

Furthermore, as described in WO 2006/064724-A, a coated tool has been proposed as well in which a surface of a tool substrate is coated with a TiCN layer and an $Al_2O_3$ layer, the TiCN layer has tensile stress S1, the $Al_2O_3$ layer has compressive stress S2, and the tensile stress S1 and the compressive stress S2 are set to satisfy a relationship of 400 MPa≤|S2−S1|≤3500 MPa, thereby procuring both toughness and wear resistance.

Problem that the Invention is to Solve

The performance of a cutting device has been significantly developed in recent years, and there has been a strong demand for labor saving and energy saving, and furthermore, cost reduction in a cutting process, and accordingly, there is a tendency for the speed of a cutting process to become faster.

In the above-described coated tool of the related art, the chipping resistance and wear resistance of the coated tool under high-speed cutting conditions are improved by adjusting the texture coefficient TC of the upper layer of the $Al_2O_3$ layer or by specifying a residual stress relationship between the upper layer of the $Al_2O_3$ layer and the lower layer of the TiCN layer; however, currently, it is difficult to improve both characteristics of chipping resistance and wear resistance at the same time, and, depending on the kind, cutting conditions and the like of a material to be cut, the service life may end within a short period of time due to the occurrence of chipping, the degradation of wear resistance, and the like.

Means for Solving the Problem

As a result, to simultaneously improve the chipping resistance and wear resistance of a hard coating layer in a coated tool during a high-speed cutting process of a high-toughness difficult-to-cut material such as ductile cast iron from the above-described viewpoint, the present inventors and the like intensively carried out studies with attention paid to the orientation of the $Al_2O_3$ layer that is the upper layer of the hard coating layer, and consequently, obtained the following knowledge.

First, while the wear resistance can be ensured by, for example, controlling the orientation of the $Al_2O_3$ layer to a specific orientation such as (006) orientation, the chipping resistance is not sufficient due to a residual stress formed in the layer.

Therefore, to remove the residual stress and improve the chipping resistance, an attempt was made to remove the residual stress in the upper layer consisting of the $Al_2O_3$ layer by carrying out a variety of surface treatments such as a brush treatment, a blast treatment (a sand blast treatment or a wet blast treatment) and a shot peening treatment as described in WO 2006/064724-A, but it was found that, in a case in which the $Al_2O_3$ layer was highly (006)-oriented, a sufficient effect that alleviated the residual stress was not obtained, and therefore it was not possible to say that the chipping resistance was sufficiently improved.

That is, in the coated tool of the related art that was highly (006)-oriented as described in JP-A-2009-28894, while the wear resistance was excellent, the chipping resistance was not sufficient, and, even when the surface treatments were carried out after the formation of the hard coating layer to alleviate the residual stress for the purpose of improving the chipping resistance, the effect that alleviated the residual stress was small, and therefore the chipping resistance was still unsatisfactory.

In spite of what has been described above, the inventors and the like found that, even in a case in which a predetermined proportion was (006)-oriented and a predetermined degree of wear resistance was provided in the upper layer consisting of the $Al_2O_3$ layer, when the upper layer was adjusted so as to be (104)-oriented and be (110)-oriented at a predetermined ratio at the same time, it was possible to improve the effect of the surface treatments after the formation of the hard coating layer that alleviated the residual stress, and therefore the chipping resistance could be improved, whereby the coated tool was provided with tool characteristics that were excellent in terms of both wear resistance and chipping resistance.

SUMMARY OF THE INVENTION

The invention has been made based on the above-described knowledge, and there is provided:

a surface-coated cutting tool comprising a lower layer consisting of a titanium compound layer and an upper layer consisting of an aluminum oxide layer deposited on a surface of a tool substrate constituted of a tungsten carbide-based cemented carbide as a hard coating layer, in which, in the upper layer consisting of the aluminum oxide layer, a (006) plane texture coefficient TC(006) is 1.8 or more, a ratio I(104)/I(110) of a peak intensity I(104) of an (104) plane to a peak intensity I(110) of an (110) plane is in a range of 0.5 to 2.0, and furthermore, an absolute value of residual stress in the aluminum oxide layer is 100 MPa or less.

Next, the component layers of the hard coating layer of the coated tool of the invention will be described in detail.

Lower Layer (Ti Compound Layer):

A Ti compound layer consisting of one or more layers of a Ti carbide (TiC) layer, a Ti nitride (TiN) layer, a Ti carbonitride (TiCN) layer, a Ti carboxide (TiCO) layer and a Ti carbon-nitrogen oxide (TiCNO) layer can be used as the lower layer of the Ti compound layer. The lower layer has high-temperature strength, provides high-temperature strength to the hard coating layer, furthermore, strongly adheres to both the tool substrate and the $Al_2O_3$ layer that is the upper layer, and has an action of contributing to the improvement of the adhesion of the hard coating layer to the tool substrate.

The lower layer cannot sufficiently exhibit the above-described action at a total average layer thickness of less than 3 µm, and, on the other hand, when the total average layer thickness thereof exceeds 20 µm, chipping becomes likely to occur, and therefore the total average layer thickness of the lower layer is desirably set in a range of 3 µm to 20 µm.

Upper Layer ($Al_2O_3$ Layer):

The $Al_2O_3$ layer has excellent high-temperature hardness and thermal resistance, and contributes to the improvement of the wear resistance of the hard coating layer; however, for example, in a high-speed cutting process of a high-toughness difficult-to-cut material such as ductile cast iron, a large shear stress acts in the vicinity of the ridge line of a cutting edge due to the friction between a material to be cut and chips, and consequently, cracks are likely to be generated in the vicinity of the ridge line of the cutting edge, and the propagation of the cracks makes chipping or peeling likely to occur.

Therefore, in the invention, from the viewpoint of improving both characteristics of chipping resistance and wear resistance in a high-speed cutting process of a difficult-to-cut material such as ductile cast iron, the upper layer coating a ridge line section of a cutting edge in the coated tool is constituted of a high-hardness $Al_2O_3$ layer with a high TC(006), and the residual stress in the $Al_2O_3$ layer has been reduced, thereby improving the chipping resistance and peeling resistance of the hard coating layer.

Specifically, first, the TC(006) of the $Al_2O_3$ layer configuring the upper layer is increased, and simultaneously, regarding the peak intensity I(104) of an (104) plane and the peak intensity I(110) of an (110) plane, an $Al_2O_3$ layer having a crystalline organization structure producing an I(104)/I(110) in a range of 0.5 to 2.0 is deposited.

Next, when, for example, a wet blast treatment is carried out on the $Al_2O_3$ layer so as to remove the residual stress in the layer, since the I(104)/I(110) is in a range of 0.5 to 2.0 even in a case in which the TC(006) of the $Al_2O_3$ layer is as high as 1.8 or more, the residual stress value in the $Al_2O_3$ layer is reduced to 100 MPa or less in terms of the absolute value.

As a result, the upper layer of the invention consisting of the $Al_2O_3$ layer has high hardness and excellent wear resistance, and simultaneously, has a small residual stress value in the layer, and therefore the chipping resistance and the peeling resistance are also excellent.

Meanwhile, the (006) plane texture coefficient TC(006) stated in the invention is defined as follows in a case in which the peak intensity value of X-ray diffraction obtained from a (hkl) plane when carrying out X-ray diffraction on the $Al_2O_3$ layer configuring the upper layer is represented by I(hkl), and the standard diffraction intensity of the (hkl) plane described in JCPDS card No. 46-1212 is represented by I0(hkl):

$$TC(006) = \frac{I(006)}{I_0(006)} \left\{ \frac{1}{8} \sum \frac{I(hkl)}{I_0(hkl)} \right\}^{-1}.$$

Here, the (hkl) planes are eight planes of (012), (104), (110), (006), (113), (202), (024) and (116).

As an example, FIG. 1 illustrates an X-ray diffraction chart obtained from measurements in the upper layer of the coated tool of the invention, and also illustrates the peak intensities I(hkl) of the (hkl) planes illustrated in the chart.

A more specific method for forming an $Al_2O_3$ layer having the above-described crystalline organization structure can be described, for example, as follows.

That is, after a lower layer consisting of a Ti compound layer having a predetermined layer thickness is deposited under ordinary film-forming conditions on a tool substrate that is made of a WC cemented carbide and has a honing-processed cutting edge section, <<First Phase>> first, $Al_2O_3$ nuclei are formed on a surface of the lower layer in an ordinary chemical deposition device under conditions of reaction gas composition (volume %): $AlCl_3$: 0.5% to 2%, $CO_2$: 0.1% to 1.5%, HCl: 0.3% to 3%, CO: 0.1% to 1.5%, $CH_4$: 0.5% to 2.0%, Ar: 20% to 35%, $H_2$: remainder, reaction atmosphere temperature: 950° C. to 1100° C., and
reaction atmosphere pressure: 6 kPa to 13 kPa;
<<Second Phase>>
next, an $Al_2O_3$ film is grown, similarly, using an ordinary chemical deposition device under conditions of
reaction gas composition (volume %): $AlCl_3$: 1% to 5%, $CO_2$: 0.1% to 2%, HCl: 0.3% to 3%, $H_2S$: 0.5% to 1%, Ar: 20% to 35%, $H_2$: remainder,
reaction atmosphere temperature: 950° C. to 1100° C., and
reaction atmosphere pressure: 6 kPa to 13 kPa;
<<Third Phase>>
next, the $Al_2O_3$ film is grown, similarly, using an ordinary chemical deposition device under conditions of
reaction gas composition (volume %): $AlCl_3$: 0.5% to 2%, $CO_2$: 0.1% to 1.5%, HCl: 4% to 7%, $H_2S$: 0.02% to 0.4%, $H_2$: remainder,
reaction atmosphere temperature: 950° C. to 1100° C., and
reaction atmosphere pressure: 6 kPa to 13 kPa,
thereby obtaining an $Al_2O_3$ layer having a target layer thickness.

With the film-forming process having the above-described three steps, it is possible to deposit an upper layer consisting of an $Al_2O_3$ layer having the crystalline organization structure of the invention, that is, an $Al_2O_3$ layer in which the TC(006) is 1.8 or more and the ratio I(104)/I(110) of the peak intensity I(104) of the (104) plane to the peak intensity I(110) of the (110) plane is in a range of 0.5 to 2.0.

Subsequently, for example, a wet blast treatment is carried out on a surface of the above-obtained upper layer consisting of the $Al_2O_3$ layer having the crystalline organization structure of the invention, thereby reducing the residual stress in the upper layer.

Specific wet blast treatment conditions are that, for example, a polishing solution obtained by blending $Al_2O_3$ fine grains at a proportion of 15 mass % to 60 mass % with respect to the total amount of the fine grains and water is sprayed to the entire tool surface at a blast pressure in a range of 0.05 MPa to 0.30 MPa as a spray polishing material.

Since the $Al_2O_3$ layer of the invention has an I(104)/I(110) in a range of 0.5 μm to 2.0 μm in spite of a high TC(006) of 1.8 or more, the residual stress is effectively alleviated, the absolute value of the residual stress is reduced up to 100 MPa or less, and consequently, a hard coating layer having excellent chipping resistance and wear resistance is formed.

When the TC(006) becomes less than 1.8, since the hardness of the $Al_2O_3$ layer of the invention decreases, it is not possible to exhibit excellent wear resistance over long-term use, and therefore the TC(006) was specified to 1.8 or more. The upper limit of the TC(006) is not particularly limited, but the TC(006) is required to be in a range of 1.8 to 3.0 to obtain a predetermined high hardness.

In addition, regarding the value of the I(104)/I(110), when this value is less than 0.5 or exceeds 2.0, it becomes impossible to obtain the effect that alleviates the residual stress by the surface treatment, and therefore the value of I(104)/I(110) was specified in a range of 0.5 to 2.0.

In addition, regarding the absolute value of the residual stress, when the absolute value is larger than 100 MPa, the chipping resistance does not improve, and therefore the absolute value was specified to 100 MPa or less.

The upper layer of the invention consisting of the $Al_2O_3$ layer can be deposited on the entire tool surface (rake surface, flank surface and cutting edge) through the film-forming process having the above-described three steps, but it is not always necessary to form the upper layer on the entire tool surface, and it is surely possible to deposit the $Al_2O_3$ layer having the crystal organization structure of the invention only on the rake surface including the ridge line section of the cutting edge or only on the flank surface including the ridge line section of the cutting edge.

Meanwhile, the $Al_2O_3$ layer having the crystal organization structure of the invention is not capable of exhibiting desired wear resistance over a long period of time when the layer thickness is less than 2 μm, and, when the layer thickness exceeds 15 μm, chipping becomes likely to occur, and therefore the layer thickness is desirably set in a range of 2 μm to 15 μm.

Advantage of the Invention

The coated tool of the invention is provided with the lower layer consisting of the Ti compound layer and the upper layer consisting of the $Al_2O_3$ layer as the hard coating layer, the upper layer of the $Al_2O_3$ layer has excellent high-temperature hardness, and furthermore, the residual stress in the $Al_2O_3$ layer can be reduced, and therefore the coated tool exhibits excellent wear resistance, chipping resistance and peeling resistance over long-term use even in a case in which the coated tool is used under high-speed cutting conditions accompanying the generation of heat.

BRIEF DESCRIPTION OF THE DRAWING

These and other features and advantages of the present invention will become more readily appreciated when considered in connection with the following detailed description and appended drawing, wherein like designations denote like elements in the various views, and wherein:
FIG. 1 illustrates an X-ray diffraction chart obtained from measurements in an upper layer of a coated tool of the invention, and the locations and peak intensity values I(hkl) of (hkl) planes.

DETAILED DESCRIPTION OF THE INVENTION

Best Mode for Carrying Out the Invention

Next, the coated tool of the invention will be specifically described using examples.

EXAMPLES

WC powder, TiC powder, ZrC powder, TaC powder, NbC powder, $Cr_3C_2$ powder, TiN powder and Co powder all of which had an average grain diameter in a range of 1 μm to 3 μm were prepared as powder-form raw materials, and the powder-form raw materials were blended in accordance with the blending compositions described in Table 1. Wax was further added, and the mixture was mixed using a ball mill for 24 hours in acetone, depressurized, dried, and then pressed into a powder compact having a predetermined shape with a pressure of 98 MPa. The powder compact was vacuum-sintered in a vacuum of 5 Pa at a predetermined temperature in a range of 1370° C. to 1470° C. under a condition of one-hour holding, and, after sintering, a 0.07 mm-radius honing process was carried out on a cutting edge section, thereby manufacturing WC-based cemented carbide tool substrates A and B having an insert shape described in ISO·CNMG 120408.

Next, Ti compound layers described in Table 3 were deposited on surfaces of the tool substrates A and B as the lower layer of the hard coating layer using an ordinary chemical deposition device under conditions described in Table 2, subsequently, an $Al_2O_3$ layer was deposited on a surface of each of the Ti compound layers under three-phase conditions described in Table 4, and then, a wet blast treatment was carried out on a rake surface and/or a flank surface, including a ridge line section of a cutting edge, under conditions described in Table 5, thereby manufacturing invention coated tools 1 to 10 described in Table 6.

In addition, for the purpose of comparison, Ti compound layers described in Table 3 were deposited under the conditions described in Table 2 as the lower layer of the hard coating layer, subsequently, an $Al_2O_3$ layer was deposited under conditions described in Table 7, and then a wet blast treatment was carried out under the conditions described in Table 5, thereby manufacturing comparative coated tools 1 to 10 described in Table 8.

The layer thicknesses of the Ti compound layers and the $Al_2O_3$ layers on the rake surfaces, the flank surfaces and the ridge line sections of the cutting edge of the invention coated tools and the comparative coated tools were measured using a scanning electron microscope, X-ray diffraction was carried out on the $Al_2O_3$ layers, TC(006) was obtained by measuring the X-ray diffraction peak intensities from the respective planes of (012), (104), (110), (006), (113), (202), (024) and (116), and furthermore, a peak intensity ratio I(104)/I(110) was obtained from the respective values of the peak intensities I(104) and I(110) from (104) and (110).

Tables 6 and 8 describe the values.

In addition, for the $Al_2O_3$ layers in the invention coated tools and the comparative coated tools, the values of residual stresses were measured using a $\sin^2 \psi$ method and an X-ray diffraction device. The diffraction peak of $\alpha Al_2O_3$ on the (13_10) plane was used for the measurement, and computation was carried out using a Young's modulus of 384 GPa and a Poisson's ratio of 0.232.

Tables 6 and 8 describe the values.

TABLE 1

| Type | Blending composition (mass %) | | | | | | | |
|---|---|---|---|---|---|---|---|---|
| | Co | TiC | ZrC | TaC | NbC | $Cr_3C_2$ | TiN | WC |
| Tool substrate A | 5.5 | 1 | — | 3.2 | 0.5 | — | 0.8 | balance |
| Tool substrate B | 6.8 | 1 | 0.5 | 2.1 | 0.5 | 0.3 | — | balance |

TABLE 2

| Component layers of hard coating layer | | Forming conditions (the units for the pressure and temperature of the reaction atmosphere are kPa and ° C.) | | |
|---|---|---|---|---|
| | | Reaction gas composition | Reaction atmosphere | |
| Type | Symbol | (volume %) | Pressure | Temperature |
| TiC | TiC | $TiCl_4$:4.2%, $CH_4$:8.5%, $H_2$: balance | 7 | 1020 |
| TiN (first layer) | TiN | $TiCl_4$:4.2%, $N_2$:30%, $H_2$: balance | 30 | 900 |
| TiN (other layers) | TiN | $TiCl_4$:4.2%, $N_2$:35%, $H_2$: balance | 50 | 1040 |
| I-TiCN | I-TiCN | $TiCl_4$:2%, $CH_3CN$:0.7%, $N_2$:10%, $H_2$: balance | 7 | 900 |
| TiCN | TiCN | $TiCl_4$:2%, $CH_4$:1%, $N_2$:15%, $H_2$: balance | 13 | 1000 |
| TiCO | TiCO | $TiCl_4$:4.2%, CO:4%, $H_2$: balance | 7 | 1020 |
| TiCNO | TiCNO | $TiCl_4$:2%, CO:1%, $CH_4$:1%, $N_2$:5%, $H_2$: balance | 13 | 1000 |

TABLE 3

| Type | | Tool substrate symbol | Lower layer of hard coating layer (Ti compound layer) | | | | | Total layer thickness of lower layer (mm) |
|---|---|---|---|---|---|---|---|---|
| | | | First layer | Second layer | Third layer | Fourth layer | Fifth layer | |
| Invention coated tools and comparative coated tools | 1 | A | TiN (1) | I-TiCN (4) | TiN (0.5) | TiC (1) | TiCO (0.5) | 7 |
| | 2 | B | TiN (0.1) | TiCN (2) | TiN (0.4) | I-TiCN (7.5) | — | 10 |
| | 3 | A | TiN (0.3) | I-TiCN (2.5) | TiCO (0.2) | — | — | 3 |
| | 4 | A | TiN (1) | I-TiCN (6) | TiN (0.5) | TiCNO (0.5) | — | 8 |
| | 5 | B | TiN (1) | I-TiCN (11) | TiCNO (1) | — | — | 13 |
| | 6 | B | TiN (0.5) | TiC (1) | I-TiCN (7) | TiN (1) | TiCNO (0.5) | 10 |
| | 7 | B | TiN (0.5) | TiCN (1) | I-TiCN (3) | TiCO (0.5) | — | 5 |
| | 8 | A | TiN (1) | I-TiCN (5) | TiN (1.5) | TiCO (0.5) | — | 8 |
| | 9 | B | TiN (0.5) | TiC (2) | I-TiCN (6) | TiCO (0.5) | — | 9 |
| | 10 | A | TiN (1) | I-TiCN (13) | TiN (0.5) | TiCNO (0.5) | — | 15 |

(Note)
numeric values in parenthesis for the respective layers are target layer thicknesses (μm).

TABLE 4

| Al₂O₃ layer | | Film-forming conditions (the units for the pressure and temperature of the reaction atmosphere are kPa and °C.) | | |
|---|---|---|---|---|
| | | Reaction gas composition | Reaction atmosphere | |
| Type | | (volume %) | Pressure | Temperature |
| A | First phase | AlCl₃:0.7, CO₂:0.1, HCl:2.1, CO:1.5, CH₄:0.5, Ar:28.2, H₂: balance | 6 | 950 |
| | Second phase | AlCl₃:1.0, CO₂:1.2, HCl:2.1, H₂S:0.5, Ar:29.0, H₂: balance | 8.5 | 1020 |
| | Third phase | AlCl₃:2.0, CO₂: 1.5, HCl:5.2, H₂S:0.2, H₂: balance | 8.5 | 1020 |
| B | First phase | AlCl₃:0.5, CO₂:1.0, HCl:3.0, CO:0.1, CH₄:2.0, Ar:35.0, H₂: balance | 10.5 | 980 |
| | Second phase | AlCl₃:5.0, CO₂:0.1, HCl:3.0, H₂S:1.0, Ar:35.0, H₂: balance | 10.5 | 1000 |
| | Third phase | AlCl₃:2.0, CO₂:0.1, HCl:7.0, H₂S:0.4, H₂: balance | 13 | 1050 |
| C | First phase | AlCl₃:2.0, CO₂:1.5, HCl:0.3, CO:1.1, CH₄:1.5, Ar:20.0, H₂: balance | 8 | 1000 |
| | Second phase | AlCl₃:2.5, CO₂:2.0, HCl:0.3, H₂S:0.5, Ar:20.0, H₂: balance | 8 | 1000 |
| | Third phase | AlCl₃:0.5, CO₂:0.8, HCl:4.0, H₂S:0.02, H₂: balance | 9 | 1050 |

TABLE 5

| | Wet blast treatment | |
|---|---|---|
| Treatment type | Surfaces to be treated | Treatment conditions |
| A | Rake surface and flank surface | Al₂O₃ grains in polishing solution: 30 mass %, blast pressure: 0.20 MPa |
| B | Rake surface | Al₂O₃ grains in polishing solution: 40 mass %, blast pressure: 0.25 MPa |
| C | Flank surface | Al₂O₃ grains in polishing solution: 40 mass %, blast pressure: 0.18 MPa |

TABLE 6

| | | | Lower layer | | Upper layer (Al₂O₃ layer) | | | | | | | |
|---|---|---|---|---|---|---|---|---|---|---|---|---|
| | | Tool substrate | | Layer thickness | Al₂O₃ layer | Layer thickness | Measurement surface | TC(006) of measurement surface | Peak intensity on measurement surface | | Peak intensity ratio I(104)/I(110) | Wet blast treatment type | Absolute value of residual stress (MPa) |
| Type | | symbol | Type | (μm) | type | (μm) | | | I(104) | I(110) | | | |
| Invention coated tools | 1 | A | 1 | 7 | A | 8 | Rake surface | 2 | 1356 | 954 | 1.4 | B | 82 |
| | 2 | B | 2 | 10 | C | 5 | Flank surface | 2.4 | 1391 | 1119 | 1.2 | A | 41 |
| | 3 | A | 3 | 3 | A | 10 | Rake surface | 3.2 | 1016 | 1985 | 0.5 | B | 54 |
| | 4 | A | 4 | 8 | B | 2 | Flank surface | 1.8 | 1888 | 1359 | 1.4 | C | 70 |
| | 5 | B | 5 | 13 | B | 4 | Flank surface | 2.8 | 2341 | 1201 | 2 | C | 19 |
| | 6 | B | 6 | 10 | C | 4 | Flank surface | 3 | 2015 | 1251 | 1.6 | A | 75 |
| | 7 | B | 7 | 5 | A | 15 | Flank surface | 1.9 | 1770 | 1008 | 1.8 | C | 36 |
| | 8 | A | 8 | 8 | A | 3 | Rake surface | 1.8 | 1518 | 1723 | 0.9 | B | 10 |
| | 9 | B | 9 | 9 | C | 10 | Flank surface | 2.2 | 1690 | 1568 | 1.1 | A | 35 |
| | 10 | A | 10 | 15 | B | 2 | Flank surface | 2.6 | 1652 | 2250 | 0.7 | A | 100 |

TABLE 7

| Al$_2$O$_3$ layer | | Film-forming conditions (the units for the pressure and temperature of the reaction atmosphere are kPa and °C.) | | |
|---|---|---|---|---|
| | | Reaction gas composition | Reaction atmosphere | |
| Type | | (volume %) | Pressure | Temperature |
| a | First phase | AlCl$_3$:1.5, CO$_2$:0.5, HCl:0.5, H$_2$: balance | 8.5 | 1000 |
| | Second phase | AlCl$_3$:2.5, CO$_2$:0.5, HCl:0.5, H$_2$S:0.01, H$_2$: balance | 8.5 | 1000 |
| | Third phase | AlCl$_3$:3.2, CO$_2$:0.8, HCl:1.2, H$_2$S:0.2, H$_2$: balance | 13 | 1020 |
| b | First phase | AlCl$_3$:0.8, CO$_2$:1.2, HCl:1.1, CO:0.5, Ar:16.5, H$_2$: balance | 10 | 1000 |
| | Second phase | AlCl$_3$:0.8, CO$_2$:0.8, HCl:1.0, H$_2$S:0.1, H$_2$: balance | 10 | 1020 |
| | Third phase | AlCl$_3$:4.2, CO$_2$:1.5, HCl:1.5, H$_2$S:0.2, H$_2$: balance | 7 | 1050 |
| c | First phase | AlCl$_3$:2.8, CO$_2$:1.5, HCl:1.5, CO:1.8, Ar:25.0, H$_2$: balance | 9 | 950 |
| | Second phase | AlCl$_3$:3.5, CO$_2$:1.5, HCl:1.2, H$_2$S:0.5, Ar:10, H$_2$: balance | 9 | 980 |
| | Third phase | AlCl$_3$:4.0, CO$_2$:1.5, HCl:1.2, H$_2$S:0.6, H$_2$: balance | 15 | 980 |

TABLE 8

| | | | Lower layer | | Upper layer (Al$_2$O$_3$ layer) | | | | | | | |
|---|---|---|---|---|---|---|---|---|---|---|---|---|
| | | Tool substrate | | Layer thickness | Al$_2$O$_3$ layer | Layer thickness | Measurement surface | TC(006) of measurement surface | Peak intensity on measurement surface | | Peak intensity ratio I (104)/ | Wet blast treatment | Absolute value of residual stress |
| Type | | symbol | Type | (μm) | type | (μm) | | | I (104) | I (110) | I (110) | type | (MPa) |
| Comparative coated tool | 1 | A | 1 | 7 | c | 8 | Rake surface | 3.2 | 2440 | 536 | 4.6 | B | 518 |
| | 2 | B | 2 | 10 | a | 5 | Flank surface | 0.7 | 665 | 2519 | 0.3 | A | 108 |
| | 3 | A | 3 | 3 | a | 10 | Rake surface | 2.5 | 2805 | 992 | 2.8 | B | 430 |
| | 4 | A | 4 | 8 | b | 2 | Flank surface | 0.2 | 818 | 2662 | 0.3 | C | 82 |
| | 5 | B | 5 | 13 | c | 4 | Flank surface | 0 | 876 | 2011 | 0.4 | C | 311 |
| | 6 | B | 6 | 10 | b | 4 | Flank surface | 2.2 | 2696 | 1280 | 2.1 | A | 355 |
| | 7 | B | 7 | 5 | a | 15 | Flank surface | 0.3 | 1051 | 2154 | 0.5 | C | 95 |
| | 8 | A | 8 | 8 | b | 3 | Rake surface | 1.5 | 2015 | 980 | 2.1 | B | 361 |
| | 9 | B | 9 | 9 | c | 10 | Flank surface | 0 | 1157 | 1643 | 0.7 | A | 56 |
| | 10 | A | 10 | 15 | a | 2 | Flank surface | 0.9 | 1871 | 649 | 2.9 | A | 448 |

Next, a high-speed dry cutting test (the ordinary cutting speed was 200 m/min) was carried out in a state in which all the invention coated tools and the comparative coated tools were screwed at the front end section of a tool steel cutting holder using fixing jigs under conditions of material to be cut: ductile cast iron rods,
cutting speed: 350 m/min,
cutting depth: 1.5 mm,
feed: 0.3 mm/rev, and
cutting time: 10 minutes, thereby measuring the flank wear width of the cutting edge.

The measurement results were described in Table 9.

TABLE 9

| Type | | Flank wear width (mm) | Type | | Cutting test result |
|---|---|---|---|---|---|
| Invention coated tool | 1 | 0.28 | Comparative coated tool | 1 | 2 |
| | 2 | 0.25 | | 2 | 2.8 |
| | 3 | 0.25 | | 3 | 2.3 |
| | 4 | 0.32 | | 4 | 3.2 |
| | 5 | 0.21 | | 5 | 2 |
| | 6 | 0.24 | | 6 | 1.8 |
| | 7 | 0.22 | | 7 | 3.5 |
| | 8 | 0.29 | | 8 | 2.6 |
| | 9 | 0.22 | | 9 | 2.3 |
| | 10 | 0.19 | | 10 | 1.5 |

(Note)
Numeric values in the cutting test result column for the comparative coated tools indicate the cutting time (minutes) elapsed until the service life ends due to chipping, fracture and the like resulting from cracks generated in the vicinity of the ridge line section of the cutting edge.

From the results described in Tables 6, 8 and 9, it is found that, since the upper layers of the hard coating layers are constituted of an $Al_2O_3$ layer in which the TC(006) is 1.8 or more, the peak intensity ratio I(104)/I(110) is in a range of 0.5 to 2.0, and furthermore the absolute value of the residual stress value in the upper layer is 100 MPa or less, the invention coated tools 1 to 10 exhibit excellent wear resistance over long-term use without causing the generation of abnormal damage such as chipping or fracture in the ridge line section of the cutting edge in a high-speed cutting process of high-toughness ductile cast iron.

On the contrary, in the comparative coated tools 1 to 10, it is evident that tensile stress in the $Al_2O_3$ layer is not sufficiently alleviated, and therefore chipping, fracture and the like occur in the cutting edge section, and the service life ends within a relatively short period of time.

INDUSTRIAL APPLICABILITY

As described above, the coated tool of the invention exhibits excellent wear resistance along with excellent chipping resistance in a high-speed cutting process of a high-toughness difficult-to-cut material such as ductile cast iron and exhibits excellent cutting performance over a long period of time, and therefore the coated tool can sufficiently satisfy the improvement of the performance of a cutting device and the labor saving and energy saving, and furthermore, cost reduction in a cutting process.

The invention claimed is:

1. A surface-coated cutting tool comprising;
    a tool substrate constituted of a tungsten carbide-based cemented carbide;
    a lower layer consisting of a titanium compound layer; and
    an upper layer consisting of an aluminum oxide layer, wherein
    the lower layer is deposited on a surface of the tool substrate,
    the lower and upper layers are formed as hard coating layers,
    the upper layer is deposited directly on a surface of the lower layer, and
    the upper layer has;
        1.8 or more of a (006) plane texture coefficient TC(006),
        0.5 to 2.0 of a ratio I(104)/I(110) of a peak intensity I(104) of an (104) plane to a peak intensity I(110) of an (110) plane, and
        100 MPa or less of an absolute value of a residual stress.

* * * * *